US010260782B2

(12) United States Patent
Savic et al.

(10) Patent No.: US 10,260,782 B2
(45) Date of Patent: Apr. 16, 2019

(54) HEAT DISSIPATION IN HERMETICALLY-SEALED PACKAGED DEVICES

(71) Applicant: Cisco Technology, Inc., San Jose, CA (US)

(72) Inventors: Jovica Savic, Santa Clara, CA (US); Mudasir Ahmad, San Jose, CA (US); Thomas Brenner, Tuebingen (DE)

(73) Assignee: Cisco Technology, Inc., San Jose, CA (US)

( * ) Notice: Subject to any disclaimer, the term of this patent is extended or adjusted under 35 U.S.C. 154(b) by 8 days.

(21) Appl. No.: 15/584,544

(22) Filed: May 2, 2017

(65) Prior Publication Data

US 2017/0234584 A1 Aug. 17, 2017

Related U.S. Application Data

(62) Division of application No. 14/617,078, filed on Feb. 9, 2015, now Pat. No. 9,688,453.

(51) Int. Cl.
| | |
|---|---|
| *F25B 21/02* | (2006.01) |
| *B65D 81/18* | (2006.01) |
| *B65D 51/24* | (2006.01) |
| *B65D 43/02* | (2006.01) |
| *H01L 35/30* | (2006.01) |

(52) U.S. Cl.
CPC .......... *F25B 21/02* (2013.01); *B65D 43/0202* (2013.01); *B65D 51/24* (2013.01); *B65D 81/18* (2013.01); *H01L 35/30* (2013.01); *H01L 2224/48227* (2013.01); *H01L 2224/48247* (2013.01)

(58) Field of Classification Search
None
See application file for complete search history.

(56) References Cited

U.S. PATENT DOCUMENTS

| | | |
|---|---|---|
| 4,654,966 A | 4/1987 | Kohara et al. |
| 5,008,868 A | 4/1991 | Ikegami |
| 5,379,188 A | 1/1995 | Winslow |
| 6,116,331 A | 9/2000 | Tustaniwskyj et al. |
| 6,728,104 B1 | 4/2004 | Ahmad et al. |
| 7,518,872 B2 | 4/2009 | Tran et al. |
| 8,202,012 B2 | 6/2012 | Stewart et al. |
| 8,451,609 B2 | 5/2013 | Olesen et al. |
| 2002/0006687 A1 | 1/2002 | Lam |
| 2013/0139524 A1 | 6/2013 | Kim et al. |

FOREIGN PATENT DOCUMENTS

WO 2008036596 A1 3/2008

*Primary Examiner* — Alexander G Ghyka
(74) *Attorney, Agent, or Firm* — Edell, Shapiro & Finnan, LLC

(57) ABSTRACT

A hermetically sealed package effectively dissipates heat generated inside the package. The hermetically sealed package includes a hermetically sealed enclosure formed from a base portion and a lid. Within the enclosure two or more heat generating elements, such as integrated circuit chips, are supported by the base portion and rise to different heights from the base portion. At least one resilient heat exchange component, such as a leaf spring, extends from the lid of the hermetically sealed enclosure to the different heights. The heat exchange component is configured to conduct heat from the plurality of heat generating elements to the lid of the enclosure.

20 Claims, 9 Drawing Sheets

HEAT DISSIPATION IN HERMETICALLY-SEALED PACKAGED DEVICES

CROSS REFERENCE TO RELATED APPLICATION

This application is a divisional of U.S. application Ser. No. 14/617,078, filed Feb. 9, 2015, the entirety of which is incorporated herein by reference.

TECHNICAL FIELD

The present disclosure relates to heat management in packaged devices.

BACKGROUND

Hermetic packaged integrated circuit devices (e.g., in silicon photonics applications) are typically used to protect the integrated circuits from changing external environmental conditions, and maintain the device functionality. Since hermetic packages are sealed from the outside environment, removing heat generated by the integrated circuits within the hermetic package may be challenging.

Hermetic packages offer advantages for the functionality of silicon photonics packages by ensuring a high level of cleanliness around delicate optical interfaces. Silicon photonic packages can generate considerable heat during operation, e.g., from a laser diode, the electronics that control the functionality of the photonics, or other circuit elements.

DESCRIPTION OF EXAMPLE EMBODIMENTS

Overview

An apparatus is provided for effectively dissipating heat generated inside a hermetically sealed package. The apparatus comprises a hermetically sealed enclosure including a base portion and a lid. Within the enclosure a plurality of heat generating elements, such as integrated circuit chips, are supported by the base portion and rise to a plurality of different heights from the base portion. At least one resilient heat exchange component, such as a leaf spring, extends from the lid of the hermetically sealed enclosure to the plurality of different heights. The heat exchange component is configured to conduct heat from the plurality of heat generating elements to the lid of the enclosure.

Detailed Description

Figure 1A:
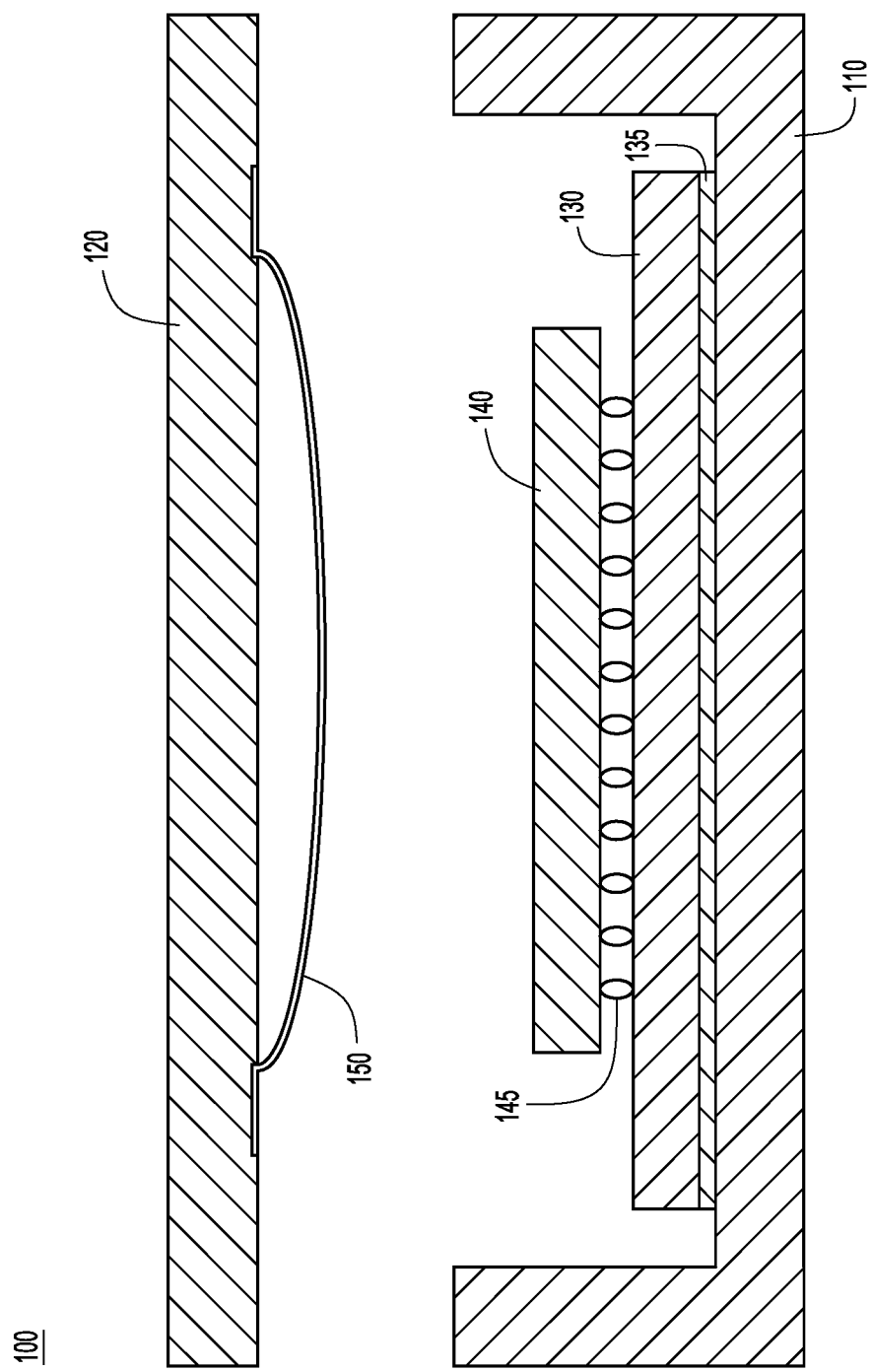
FIG. 1A shows components of an enclosure configured for heat transfer from an integrated circuit to the lid of the enclosure, according to an example embodiment.

Referring to FIG. 1A, a simplified diagram of a side view of an enclosure 100 is shown. Enclosure 100 comprises a base portion 110 and a lid portion 120. Sidewalls may be attached to the base portion 110 and/or the lid portion 120. Within the enclosure 100 a heat generating element 130 is supported by the base portion 110 and may be secured with an optional layer of adhesive 135. Heat generating element 140 is electrically connected to heat generating element 130 through electrical connections 145. A resilient heat exchange component 150 is coupled to the lid 120 such that when the enclosure 100 is closed and hermetically sealed, the component 150 makes intimate contact with at least heat generating element 140.

In one example, the heat generating element 130 may be an electronic device (e.g., a semiconductor integrated circuit) and the heat generating element 140 may be an optoelectronic device (e.g., a silicon photonic device) that is controlled by element 130. Alternatively, the functionality of element 130 may be controlled by element 140. Hereinafter, heat generating elements may include and be referred to as integrated circuits or chips. In another example, additional electrical connections (e.g., solder bumps, wire bonds, etc.) and/or optical connections (e.g., waveguides, gratings, etc.) may be included in the enclosure 100 to allow integrated circuits 130 and/or 140 to communicate with elements outside of the hermetically sealed enclosure 100.

In a further example, heat exchange component 150 may comprise a leaf spring 150 made from a resilient, heat conductive material (e.g., beryllium copper). The resilient properties of leaf spring 150 allow it to conform to integrated circuit 140 and absorb any process variations, such as height variability in silicon height, solder bump height of connection 145, and minor placement variability of integrated circuit 140 within the enclosure 100.

Figure 1B:
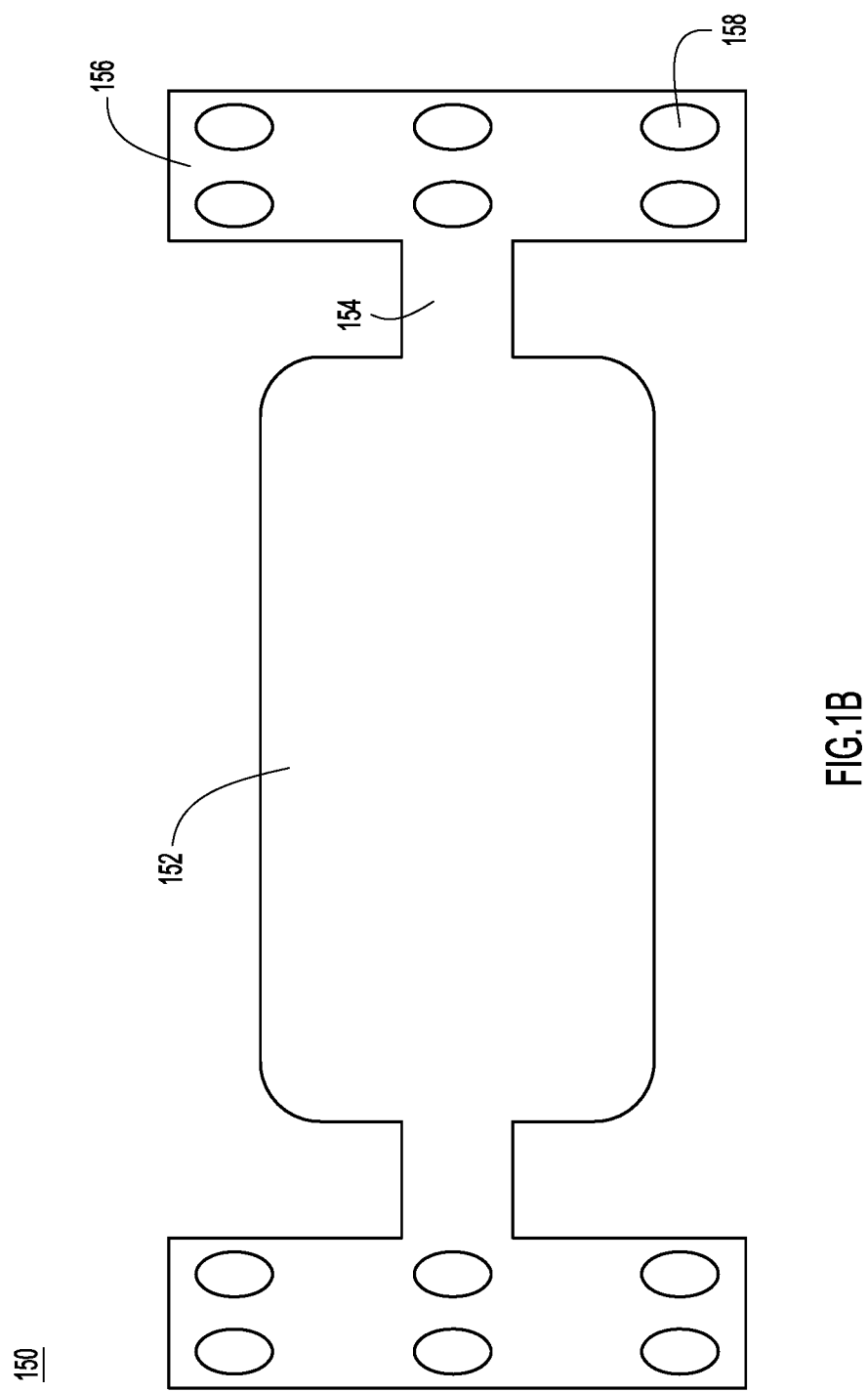
FIG. 1B shows a leaf spring to transfer heat from an integrated circuit to the lid of an enclosure, according to an example embodiment.

Referring now to FIG. 1B, a simplified block diagram of the top view of leaf spring 150 is shown. Leaf spring 150 comprises a contact surface 152 that contacts heat generating elements in the enclosure 100. The contact surface 152 is coupled through bridge 154 to the lid surface 156. The lid surface 156 is tack-welded to the lid 120 at spots 158. In one example, the size and geometry of the contact surface 152 and/or bridge 154 may be optimized to balance flexibility and thermal conductivity. In another example, the lid surface may be coupled to the lid 120 without tack welds at spots 158, such as with solder, adhesive, or by press-fitting the lid surface 156 into grooves in the lid 120. In a further example, the contact surface 152 may act as a heat spreader for the integrated circuit 140 to further mitigate localized heating effects.

Figure 1C:
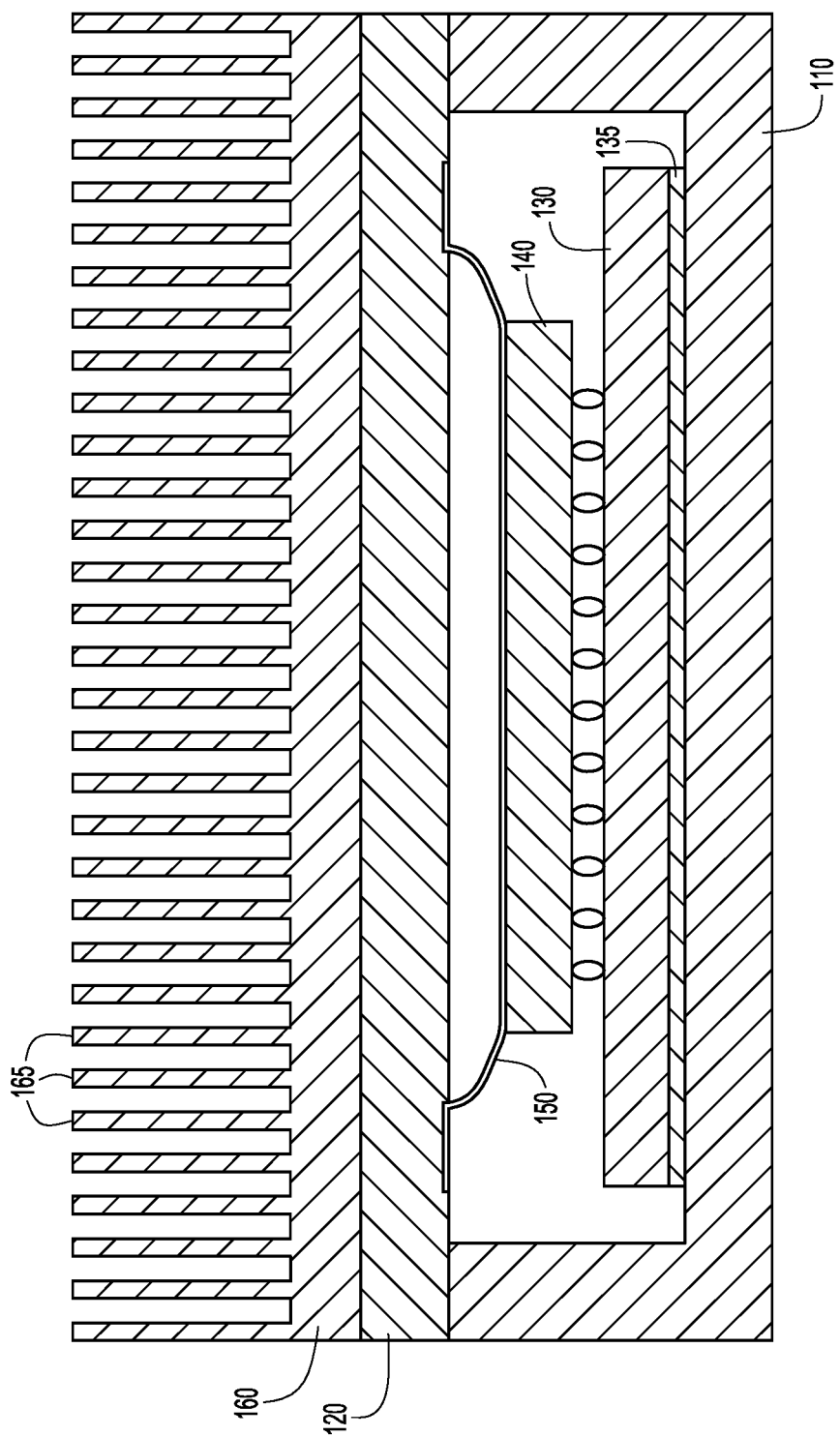
FIG. 1C shows a hermetically sealed enclosure with a leaf spring to transfer heat from an integrated circuit to an external heat sink through the lid of the enclosure, according to an example embodiment.

Referring now to FIG. 1C, a simplified diagram of a side view of enclosure 100 attached to a heat sink 160 is shown. Heat sink 160 includes cooling fins 165 to dissipate heat that is generated inside the hermetically sealed enclosure 100. The heat generated from integrated circuit 140 is conducted through leaf spring 150 and lid 120 to the heat sink 160. In one example, the heat sink 160 is coupled to the lid 120 of enclosure 100 with a thermally conductive adhesive or solder.

Figure 2:
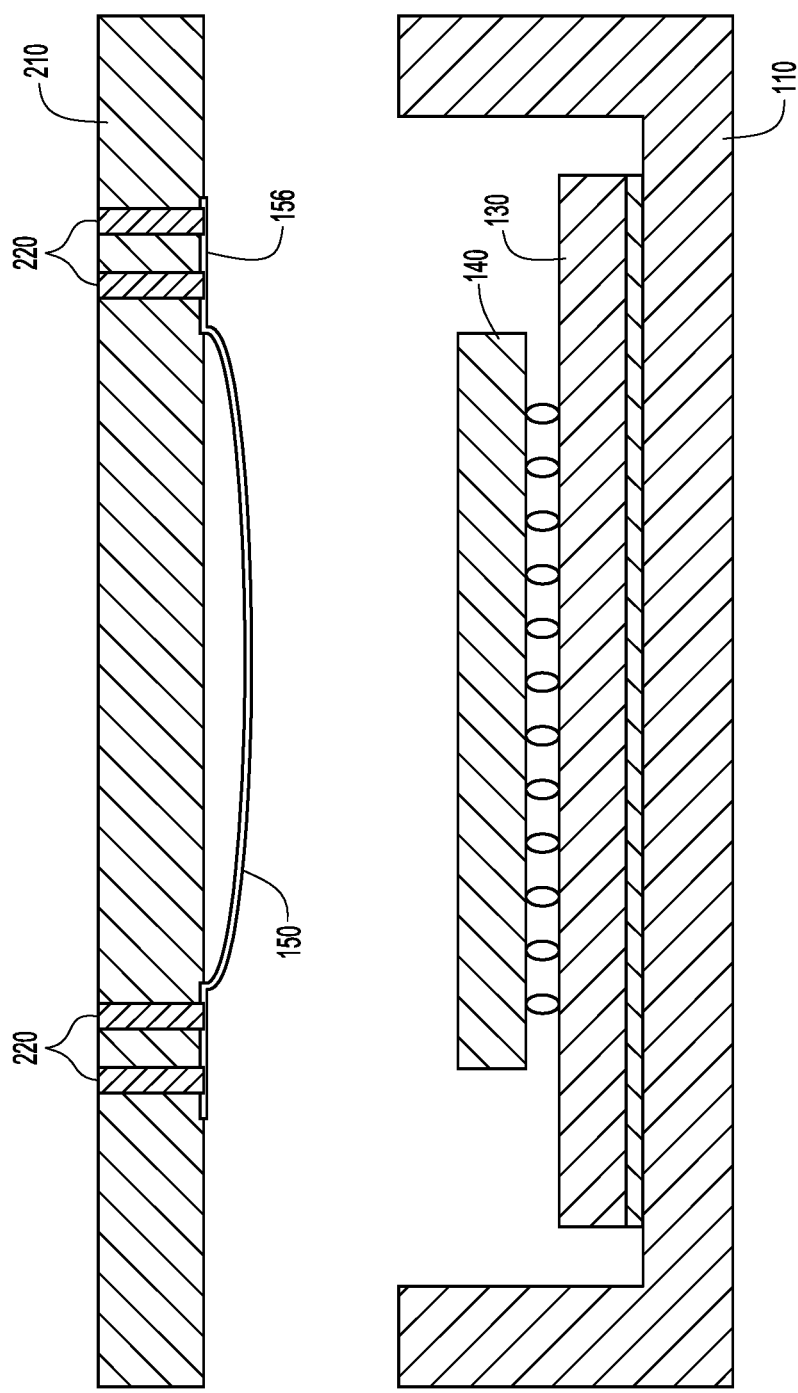
FIG. 2 shows an enclosure with an insulating lid that enables heat transfer through the lid using a leaf spring, according to an example embodiment.

Referring now to FIG. 2, a simplified diagram of an enclosure 100 with a thermally insulating lid. Lid 210 is a thermally insulating (e.g., ceramic or glass) lid to enclosure 100. In order to allow heat from inside the enclosure to reach the top surface of the lid 210 efficiently, vias 220 are formed in the lid 210 and filled with a thermally conductive material (e.g., metal). The vias 220 are formed to align with the lid surface 156, such that the heat conducted away with leaf spring 150 reaches one side of the thermally conductive vias 220. The other side of the thermally conductive vias 220 may by coupled to a heat sink 160 (not shown in FIG. 2) to dissipate the heat into the environment.

Figure 3:
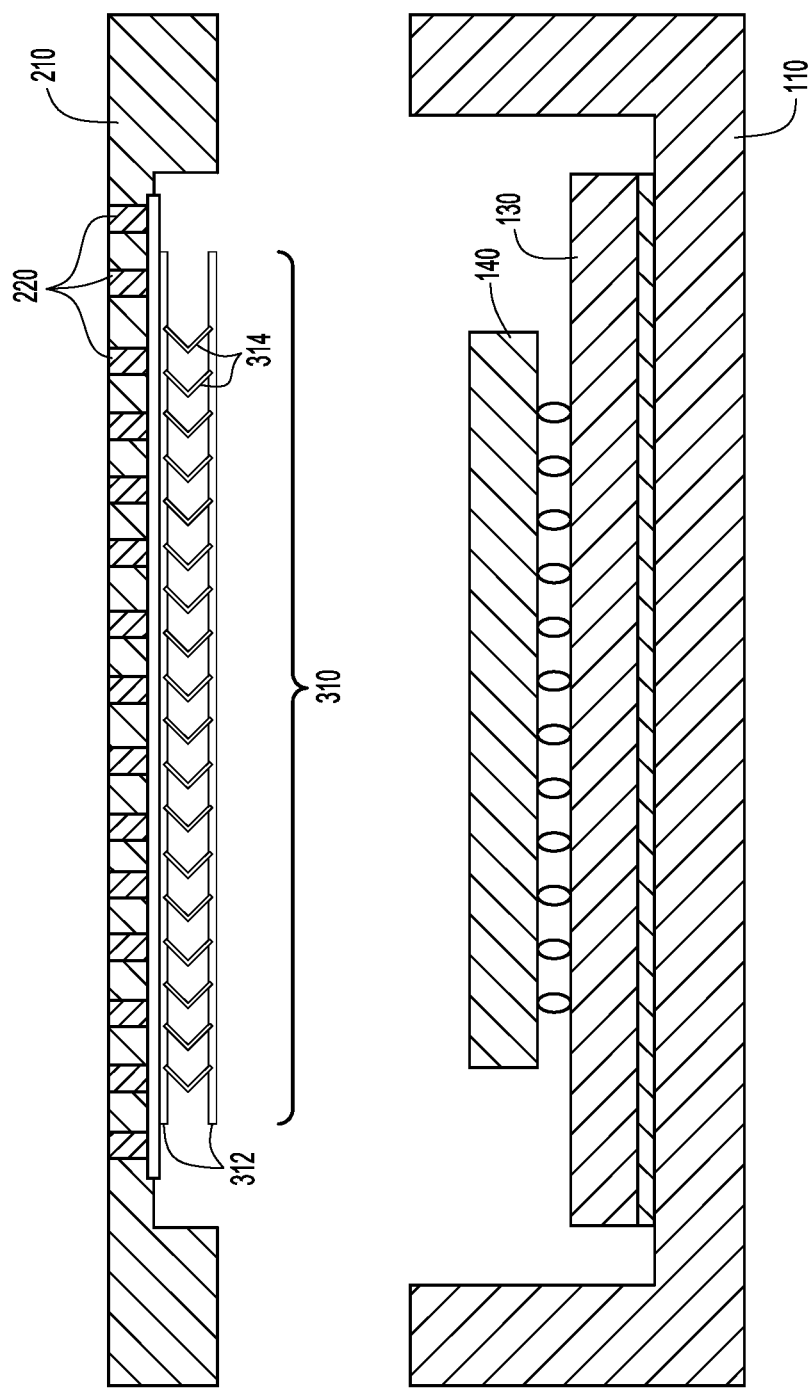
FIG. 3 shows an enclosure with an insulating lid that enables heat transfer though the lid using a bed of springs, according to an example embodiment.

Referring now to FIG. 3, a simplified diagram of an enclosure 100 that transfers heat using a bed of springs. Bed of springs 310 comprises two thermally conductive surfaces 312 with a plurality of spring elements sandwiched between the two surfaces 312. In FIG. 3, the bed of springs 310 is shown coupled to an insulating lid 210 with thermally conductive vias 220. Alternatively, the bed of springs 310 may be coupled to a substantially metal lid. In one example, the thermally conductive surfaces 312 are made from a metal such as copper or silver, which may or may not match the material in vias 220. The lid 210 may have a cavity, as shown in FIG. 3, to hold the bed of springs 310.

Figure 4:
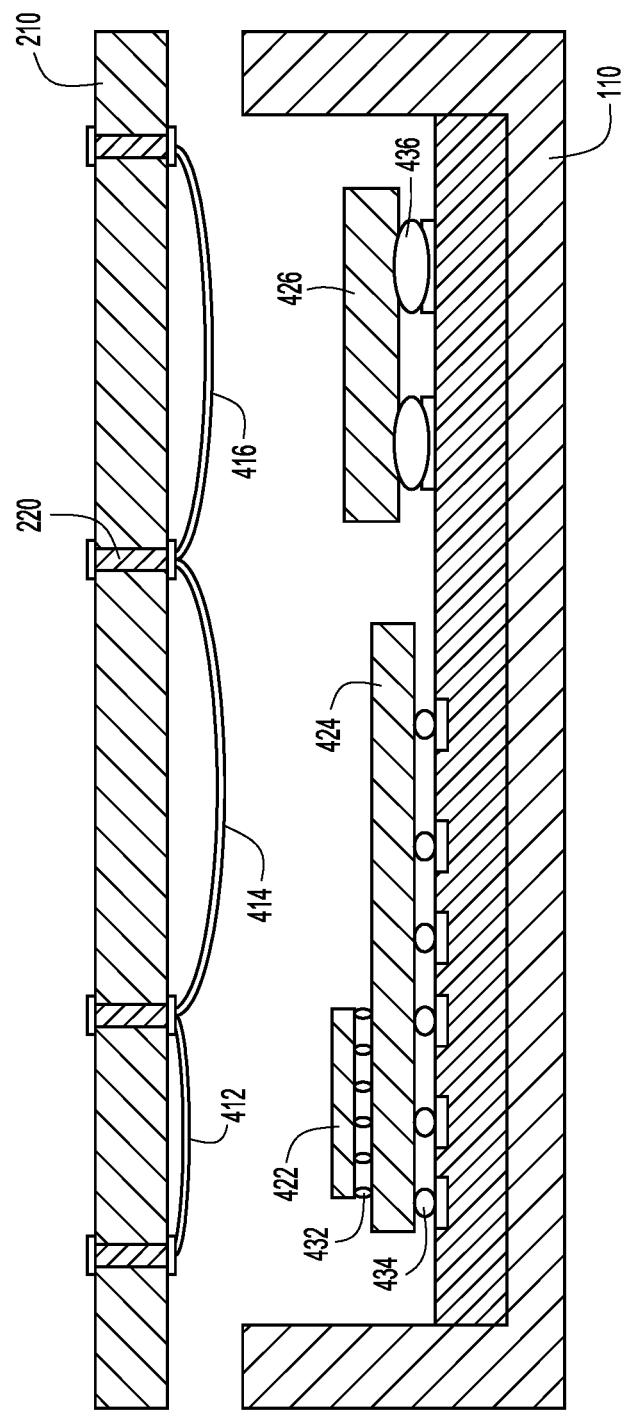
FIG. 4 shows an enclosure with a plurality of leaf springs configured to transfer heat from a plurality of integrated circuits, according to an example embodiment

Referring now to FIG. 4, a simplified diagram of an enclosure 100 with heat generating elements at various different heights is shown. Leaf springs 412, 414, and 416 are tacked at various positions on lid 210 such that they can reach different distances into the enclosure 100 when the enclosure 100 is sealed. The different distances that leaf springs 412, 414, and 416 correspond to the different heights of integrated circuits/heat generating elements 422, 424, and 426, respectively. Integrated circuit 422 is stacked on top of chip 424, and electrically connected through solder bumps 432. Integrated circuits 424 and 426 are electrically connected to devices outside the enclosure through solder bumps 434 and 436, respectively.

In one example, leaf springs 412, 414, and 416 are all part of one larger leaf spring 150 that is tacked or bent such that the sections reach to different heights corresponding to the heights of the different integrated circuits. Vias 220 may be placed in every spot that the leaf springs 412, 414, and 416 attach to the lid 210. In another example, the varying heights of the leaf springs 412, 414, 416 are configured to minimize the stresses placed on the integrated circuits 422, 424, and 426. In a further example, one or more of the leaf springs 412, 414, and 416 may be replaced with a bed of springs similar to bed of springs 310 shown in FIG. 3.

Figure 5A:
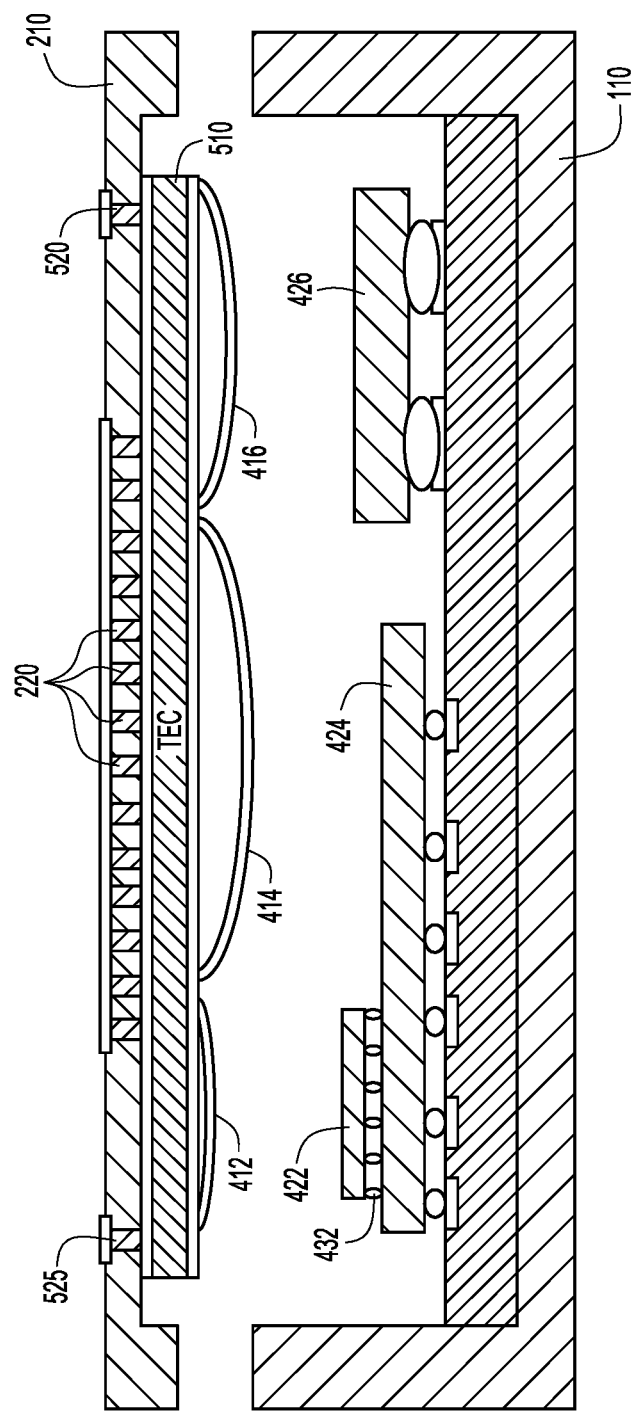
FIG. 5A shows an enclosure with a thermoelectric cooler to assist in the transfer of heat from a plurality of integrated circuits, according to an example embodiment.

Referring now to FIG. 5A, a simplified diagram of an enclosure 100 with a thermoelectric cooler is shown. A thermoelectric cooler (TEC) 510 is placed between the vias 220 and the leaf springs 412, 414, and 416. In addition to the thermally conductive vias 220, two electrically conductive vias 520 and 525 are formed in the insulating lid 210 to power the TEC 510.

In one example, the TEC 510 is a Peltier device that uses electrical power supplied through the vias 520 and 525 to generate a temperature difference between the two sides of the TEC 510. The cold side of the TEC 510 may be placed in contact with the leaf springs 412, 414, and 416 to more efficiently remove heat from the chips 422, 424, and 426. The hot side of the TEC 510 may be placed in contact with the conductive vias 220 to more efficiently transfer heat through the conductive vias to the outside environment.

In another example, the TEC 510 may be used with a metallic lid, such as lid 120 shown in FIGS. 1A-1C, if the TEC 510 is powered from power channels in one or more of the enclosed integrated circuits, e.g., integrated circuits 422, 424, or 426. In a further example, one or more of the leaf springs 412, 414, or 416 may be replaced by a bed of springs similar to the bed of springs 310 shown in FIG. 3.

Figure 5B:
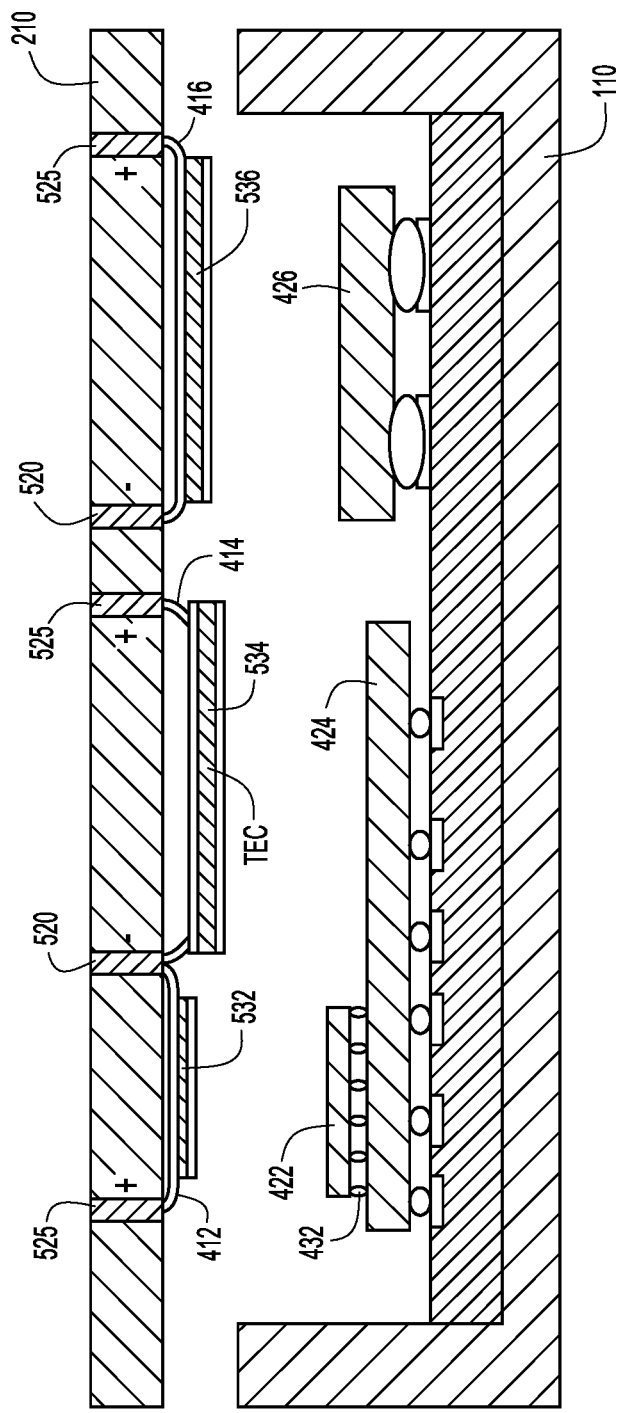
FIG. 5B shows an enclosure with a plurality of thermoelectric coolers to assist in the transfer of heat from a plurality of integrated circuits, according to an example embodiment.

Referring now to FIG. 5B, a simplified diagram of an enclosure with multiple TECs is shown. In this example, the TEC 532 is disposed between the leaf spring 412 and the integrated circuit 422. The cold side of the TEC 532 makes intimate thermal contact with the integrated circuit 422. The hot side of the TEC 532 is coupled to the leaf spring 412, which transfers the heat to metal filled vias 520 and 525 and out of the enclosure. The vias 520 and 525 also provide power to the TEC 532. Similarly, the TEC 534 is disposed between the leaf spring 414 and the integrated circuit 424, and the TEC 536 is disposed between the leaf spring 416 and the integrated circuit 426.

In one example, the TEC 536 is electrically powered through a dedicated via 520 (e.g., for negative voltage) and dedicated via 525 (e.g., for positive voltage), while the TECs 532 and 534 may use the same via 520 (e.g. for negative voltage) with dedicated vias 525 (e.g., for positive voltage). The electrically power delivered to the each TEC 532, 534, and 536 may be individually controlled to correspond to the amount of heat that integrated circuits 422, 424, and 426 generate. In this way each heat transfer component (e.g., leaf spring 412 and TEC 532, leaf spring 414 and TEC 534, etc.) can be optimized for the height of the integrated circuit and the heat the integrated circuit generates.

Figure 6:
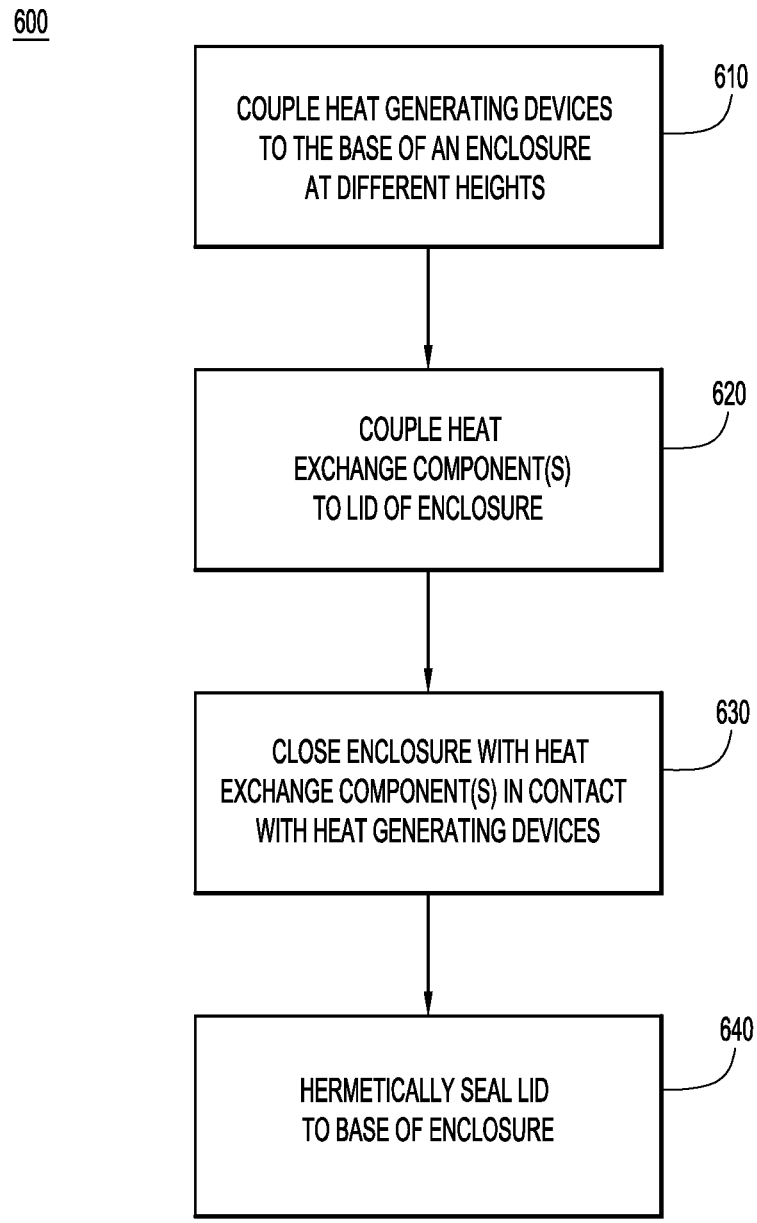
FIG. 6 is a flow diagram illustrating a method of manufacturing a hermetically sealed enclosure that dissipates heat through the lid of the enclosure, according to an example embodiment.

Referring now to FIG. 6, a flowchart showing operations in the manufacture of a hermetically sealed enclosure 100 is shown. In step 610, a plurality of heat generating devices (e.g., semiconductor integrated circuits, photonic devices, etc.) are coupled to the base of the enclosure. Some of the heat generating devices may be stacked on each other, and the heat generating devices may come to different heights above the base portion of the enclosure. In step 620, one or more heat exchange components, such as leaf springs or bed of springs, are coupled to the lid of the enclosure. The heat exchange components are coupled to the lid with a solid thermal contact to enable heat to transfer from the heat exchange component to at least a portion of the lid (e.g., a substantially metallic lid or an insulating lid with metal-filled vias). Additionally, one or more thermoelectric coolers may be included in the heat exchange components.

In step 630, the lid is placed on the base portion to enclose the heat generating devices, such that the heat exchange components are in contact with the heat generating devices. After the enclosure is closed, and the heat exchange components are in intimate thermal contact with both the lid of the enclosure and the heat generating devices at different heights, the lid is hermetically sealed to the base portion of the enclosure in step 640. In one example, the lid is hermetically sealed to the base portion by welding, soldering, or brazing techniques.

In summary, the techniques described herein present a hermetically sealed package that removes heat from functional circuit elements which emit heat during operations. The package uses a heat exchange component (e.g., a leaf spring) attached to the inside of the lid. The heat exchange component intimately contacts the various devices within the package and provides a path for heat transfer away from the devices through the lid of the package. The heat exchange component is resilient and forms an intimate contact to the heat generating elements without thermal interface materials (e.g., thermal grease) by self-compensating for any height variation which may have been the result of normal process variation during assembly. By transferring heat out of the package through the lid, the temperature inside the sealed package can be maintained at temperature below approximately 60° C. and a silicon integrated circuit stacked on a photonic inside the enclosure can be at temperature below approximately 30° C.

In one form, an apparatus is provided for effectively dissipating heat generated inside a hermetically sealed package. The apparatus comprises a hermetically sealed enclosure including a base portion and a lid. Within the enclosure a plurality of heat generating elements are supported by the base portion and rise to a plurality of different heights from the base portion. At least one resilient heat exchange component extends from the lid of the hermetically sealed enclosure to the plurality of different heights. The heat exchange component is configured to conduct heat from the plurality of heat generating elements to the lid of the enclosure.

In another form, a method for manufacturing a hermetically sealed package is provided. The method comprises coupling a plurality of heat generating devices to a base portion of an enclosure, such that the heat generating devices rise to a plurality of different heights above the base portion. The enclosure comprises the base portion and a lid. The method includes coupling at least one resilient heat exchange component to the lid of the enclosure. The enclosure is closed by hermetically sealing the lid to the base portion, such that the resilient heat exchange component comes into thermal contact with the plurality of heat generating elements at the plurality of different heights. The resilient heat exchange component transfers heat between the plurality of heat generating elements and the lid of the enclosure.

In a further form, an apparatus is provided for transferring heat from inside a hermetically sealed package. The apparatus comprises a hermetically sealed enclosure including a base portion and a lid. At least one resilient heat exchange component extends from the lid of the hermetically sealed enclosure to a plurality of different heights from the base portion at a plurality of different locations within the enclosure. The heat exchange component is configured to conduct heat from inside the enclosure through the lid of the enclosure to outside the enclosure.

The above description is intended by way of example only.

What is claimed is:

1. A method comprising:
   coupling a plurality of heat generating elements to a base portion of an enclosure, the enclosure comprising the base portion and a lid, wherein the plurality of heat generating elements rise to a plurality of different heights above the base portion;
   coupling at least one resilient heat exchange component to the lid of the enclosure by positioning a thermoelectric cooler between the resilient heat exchange component and the lid of the enclosure;
   providing electrical power to the thermoelectric cooler through conductive vias in the lid, wherein the lid is electrically insulating; and
   closing the enclosure by hermetically sealing the lid to the base portion, such that the resilient heat exchange component comes into thermal contact with the plurality of heat generating elements at the plurality of different heights and transfers heat between the plurality of heat generating elements and the lid of the enclosure.

2. The method of claim 1, further comprising coupling a heat sink to the lid of the enclosure opposite the resilient heat exchange component.

3. The method of claim 2, wherein the lid is thermally insulating, and the method further comprises forming thermally conductive vias through the lid between the resilient heat exchange component and the heat sink.

4. The method of claim 1, wherein the at least one resilient heat exchange component comprises one or more leaf springs, one or more bed of springs, or a combination of one or more leaf springs and one or more beds of springs.

5. The method of claim 1, further comprising providing electrical power to the plurality of heat generating elements through electrical connections in the base portion of the enclosure.

6. A method comprising:
   coupling a plurality of resilient heat exchange components to a lid of an enclosure, the enclosure comprising the lid and a base portion;
   positioning a thermoelectric cooler between at least one of the resilient heat exchange components and the lid of the enclosure;
   providing electrical power to the thermoelectric cooler through conductive vias in the lid, wherein the lid is electrically insulating; and
   closing the enclosure by hermetically sealing the lid to the base portion, such that the plurality of resilient heat exchange components reach a plurality of different heights from the base portion of the enclosure.

7. The method of claim 6, further comprising coupling a heat sink to the lid of the enclosure opposite the plurality of resilient heat exchange components.

8. The method of claim 7, wherein the lid is thermally insulating, and the method further comprises forming thermally conductive vias through the lid between the plurality of resilient heat exchange components and the heat sink.

9. The method of claim 6, wherein the plurality of resilient heat exchange components comprises one or more leaf springs, one or more bed of springs, or a combination of one or more leaf springs and one or more beds of springs.

10. The method of claim 6, further comprising coupling one or more heat generating devices to the base portion of the enclosure, wherein the one or more heat generating devices rise to the plurality of different heights above the base portion of the enclosure.

11. The method of claim 10, further comprising providing electrical power to the plurality of heat generating devices through electrical connections in the base portion of the enclosure.

12. A method comprising:
   coupling a heat generating device to a base portion of an enclosure, the enclosure comprising the base portion and a lid, wherein the one heat generating device rises to a plurality of different heights above the base portion;

coupling at least one resilient heat exchange component to the lid of the enclosure by positioning a thermoelectric cooler between the resilient heat exchange component and the lid of the enclosure;

providing electrical power to the thermoelectric cooler through conductive vias in the lid, wherein the lid is electrically insulating; and closing the enclosure by hermetically sealing the lid to the base portion, such that the resilient heat exchange component comes into thermal contact with the heat generating element at the plurality of different heights and transfers heat between the heat generating element and the lid of the enclosure.

13. The method of claim 12, further comprising coupling a heat sink to the lid of the enclosure opposite the resilient heat exchange component.

14. The method of claim 13, wherein the lid is thermally insulating, and the method further comprises forming thermally conductive vias through the lid between the resilient heat exchange component and the heat sink.

15. The method of claim 10, further comprising coupling at least one additional thermoelectric cooler between at least one of the plurality of resilient heat exchange components and the heat generating device at one of the plurality of different heights.

16. The method of claim 15, further comprising providing electrical power to the at least one additional thermoelectric cooler through a set of dedicated conductive vias in the lid.

17. The method of claim 15, wherein electrical power is provided to the at least one additional thermoelectric cooler through at least one of the conductive vias that provides electrical power to the thermoelectric cooler positioned between the at least one of the resilient heat exchange components and the lid of the enclosure.

18. The method of claim 12, further comprising coupling at least one additional thermoelectric cooler between at least one of the plurality of resilient heat exchange components and at least one of the one or more heat generating devices.

19. The method of claim 18, further comprising providing electrical power to the at least one additional thermoelectric cooler through a set of dedicated conductive vias in the lid.

20. The method of claim 18, wherein electrical power is provided to the at least one additional thermoelectric cooler through at least one of the conductive vias that provides electrical power to the thermoelectric cooler positioned between the resilient heat exchange component and the lid of the enclosure.

* * * * *